United States Patent [19]

Tihanyi

[11] Patent Number: 5,457,419
[45] Date of Patent: Oct. 10, 1995

[54] MOSFET WITH TEMPERATURE PROTECTION

[75] Inventor: Jenoe Tihanyi, Munich, Germany

[73] Assignee: Siemens Aktiengesellschaft, Munich, Germany

[21] Appl. No.: 192,820

[22] Filed: Feb. 7, 1994

[30] Foreign Application Priority Data

Feb. 18, 1993 [DE] Germany ............... 43 05 038.7

[51] Int. Cl.⁶ ................................................. H03K 17/14
[52] U.S. Cl. ...................... 327/378; 327/438; 327/513; 327/512
[58] Field of Search .................... 257/467, 470; 327/83, 138, 262, 371, 378, 427, 512, 438, 513; 361/103

[56] References Cited

U.S. PATENT DOCUMENTS

| | | | |
|---|---|---|---|
| 3,780,322 | 12/1973 | Walters | 327/512 |
| 4,117,505 | 9/1978 | Nakata | 327/512 |
| 4,207,481 | 6/1980 | Dobkin | 257/470 |
| 4,698,655 | 10/1987 | Schultz | 257/108 |
| 4,896,199 | 1/1990 | Tsuzuki et al. | 257/470 |
| 4,937,646 | 6/1990 | Tihanyi et al. | 257/370 |
| 5,025,298 | 6/1991 | Fay et al. | 257/470 |
| 5,187,632 | 2/1993 | Blessing | 361/103 |
| 5,221,888 | 6/1993 | Moody | 323/315 |
| 5,272,392 | 12/1993 | Wong et al. | 327/512 |
| 5,285,346 | 2/1994 | Davies et al. | 361/103 |

FOREIGN PATENT DOCUMENTS

| | | |
|---|---|---|
| 0208970 | 1/1987 | European Pat. Off. . |
| 4122653 | 1/1993 | Germany . |

*Primary Examiner*—Timothy P. Callahan
*Assistant Examiner*—Jeffrey Zweizig
*Attorney, Agent, or Firm*—Hill, Steadman & Simpson

[57] ABSTRACT

A MOSFET protection circuit includes a switch element which is thermally coupled to the MOSFET and switches the MOSFET off by establishing a connection between the gate and source electrodes thereof when a critical temperature is reached. The switch element also generates a temperature-dependent signal which controls a voltage reducing element connected between the gate and source electrodes of the MOSFET. The voltage reducing element is activated at a temperature which is lower than the critical temperature so that the gate-source voltage of the MOSFET and the current flowing therethrough is reduced as a result at the second temperature. The temperature rise is thereby slowed.

10 Claims, 3 Drawing Sheets

5,457,419

MOSFET WITH TEMPERATURE PROTECTION

BACKGROUND OF THE INVENTION

1. Field of the Invention

The present invention relates generally to a semiconductor component having a MOSFET and circuitry thermally connected to the MOSFET to electrically connect the gate and source of the MOSFET when the MOSFET reaches a predetermined temperature.

2. Description of the Related Art

European Application 0 208 970 discloses a semiconductor component in which a pn-semiconductor switch operates to connect the gate and source of a MOSFET when a critical temperature is reached, so that the MOSFET is inhibited. The switching temperature of the pn-switch is set by suitable dimensions and dopings of the switch. The semiconductor switch is thermally coupled to the MOSFET. However, when the temperature of the MOSFET changes, a temperature gradient arises between the switch and the MOSFET. When a rapid rise in temperature of the MOSFET occurs due, for example, to surge current stresses, the MOSFET can reach the critical operating temperature while the temperature of the semiconductor switch still lies below the switching temperature. The switch, thus, does not protect the MOSFET from damage.

SUMMARY OF THE INVENTION

An object of the present invention is to overcome problems in the known MOSFET protection circuits and to reliably protect against temperature-caused destruction of the MOSFET from rapidly increasing currents.

This and other objects and advantages of the invention are achieved by a first means for generating a temperature-dependent signal, the signal being supplied to a second means that is connected between the gate and the source terminals of the MOSFET, the voltage at the gate and source terminals being reduced by the second means when a second temperature is reached that is lower than the first temperature.

DETAILED DESCRIPTION OF THE PREFERRED EMBODIMENTS

Figure 1:
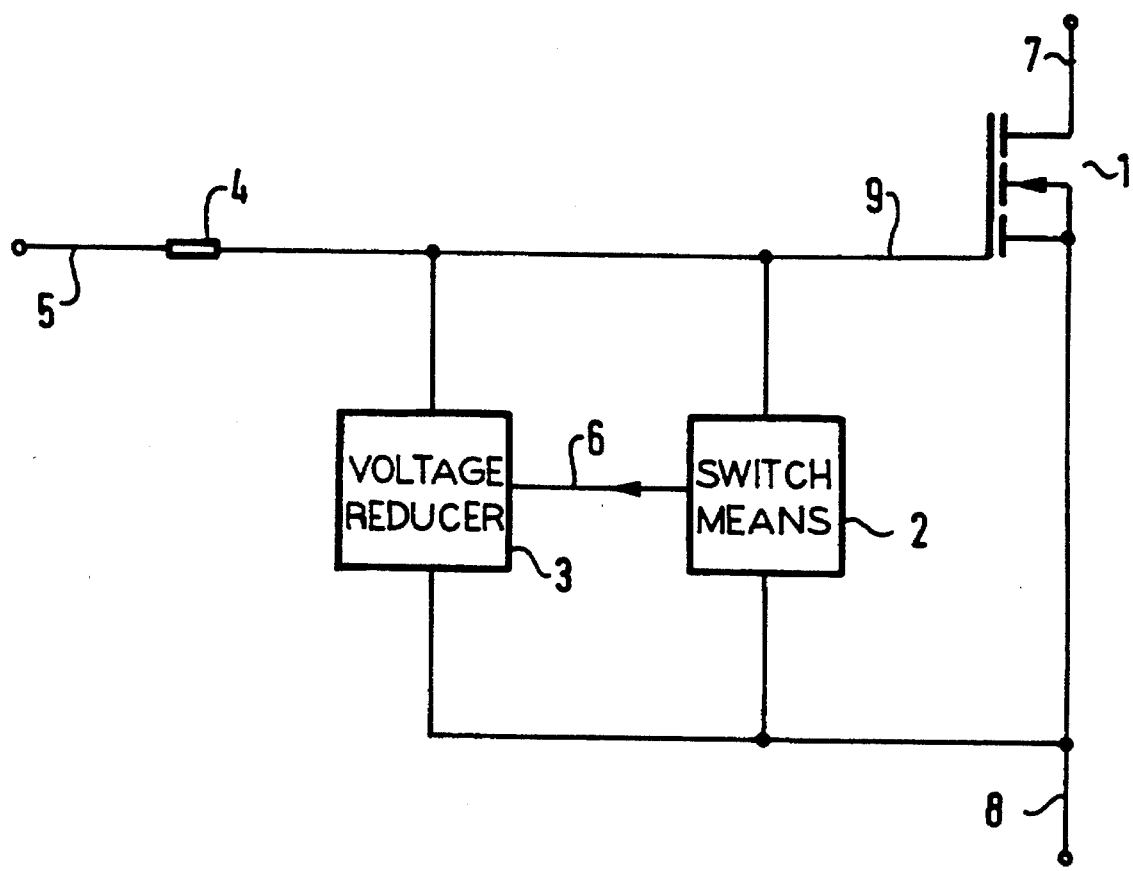
FIG. 1 is a block circuit diagram of a semiconductor component according to the principles of the present invention.

A semiconductor component is shown schematically in FIG. 1 including a MOSFET which is a self-inhibiting n-channel MOSFET of the enhancement type. The MOSFET 1 has a drain electrode 7, a source electrode 8 and a gate electrode 9. The gate electrode 9 is connected to a control terminal 5 of the semiconductor component through a voltage drop resistor 4. The on-state resistance of the drain-source path is controlled by the gate-source voltage. When the gate-source voltage lies below a threshold voltage, the MOSFET 1 is inhibited; otherwise, it is conductive. When a voltage is applied to the drain and source electrodes of the MOSFET 1, a current flows through the drain-source path, and as a result thereof the MOSFET 1 is heated.

A first means, or switch means, 2 is thermally coupled to the MOSFET 1 and is connected between the gate and the source electrodes 9 and 8, respectively, of the MOSFET 1. The first means 2 includes a switch that has at least one pn-junction that switches on, i.e. becomes conductive, when the pn-junction reaches a first temperature T1 as the result of heating by the MOSFET 1. The conductive state of the switch in the first means 2 connects the gate and the source of the MOSFET 1 to one another, so that the MOSFET 1 is turned off. Of course, the voltage drop across the activated pn-switch must be lower than the threshold voltage of the MOSFET 1 to turn the MOSFET off.

Means are also provided in the first means 2 for generating a temperature-dependent signal. The temperature-dependent signal may be a voltage level signal wherein the voltage increases with increasing temperature. The temperature-dependent signal is conducted out of the means 2 at an output 6. It is also possible to use a current control, temperature-dependent signal for this purpose wherein the current changes with temperature instead of the voltage.

A second means 3 is connected between the gate and source electrodes 9 and 8, respectively, of the MOSFET 1. The second means 3 is connected to the output 6 of the first means 2 so that the temperature-dependent voltage signal generated by the first means 2 is supplied to the second means 3. The voltage between the gate and source of the MOSFET 1 is reduced by the second means 3 when the temperature-dependent signal at the terminal 6 reaches a value which corresponds to a second temperature T2, the second temperature T2 being lower than the first temperature T1 at which the semiconductor switch of the first means 2 switches to a conductive state. This can, for example, occur when the temperature-dependent signal level reaches a specific voltage relative to that of the source terminal 8 that corresponds to the second temperature T2. As a result, a current path between the gate 9 and the source 8 of the MOSFET 1 is established so that a current is drawn via the control terminal 5 and the resistor 4 to the source terminal 8. This results in the gate-source voltage of the MOSFET 1 being reduced. As a result, the current flowing through the drain-source path of the MOSFET 1 is reduced, which results in the temperature increase of the MOSFET 1 being decelerated. In other words, the rising temperature is slowed by the second means 3 so that less of a temperature gradient exists between the MOSFET 1 and the first means thermally connected thereto at higher currents. The MOSFET 1 is thereby prevented from being destroyed or damaged due to the temperature gradient between the MOSFET 1 and the first means 2 when there is a rapid rise in the current through the MOSFET 1. The MOSFET 1 can be driven more highly conductive by i.e. at higher powers, since the safety margin of its gate-source voltage below the maximally allowable value can be sent to a narrower value.

Figure 2:
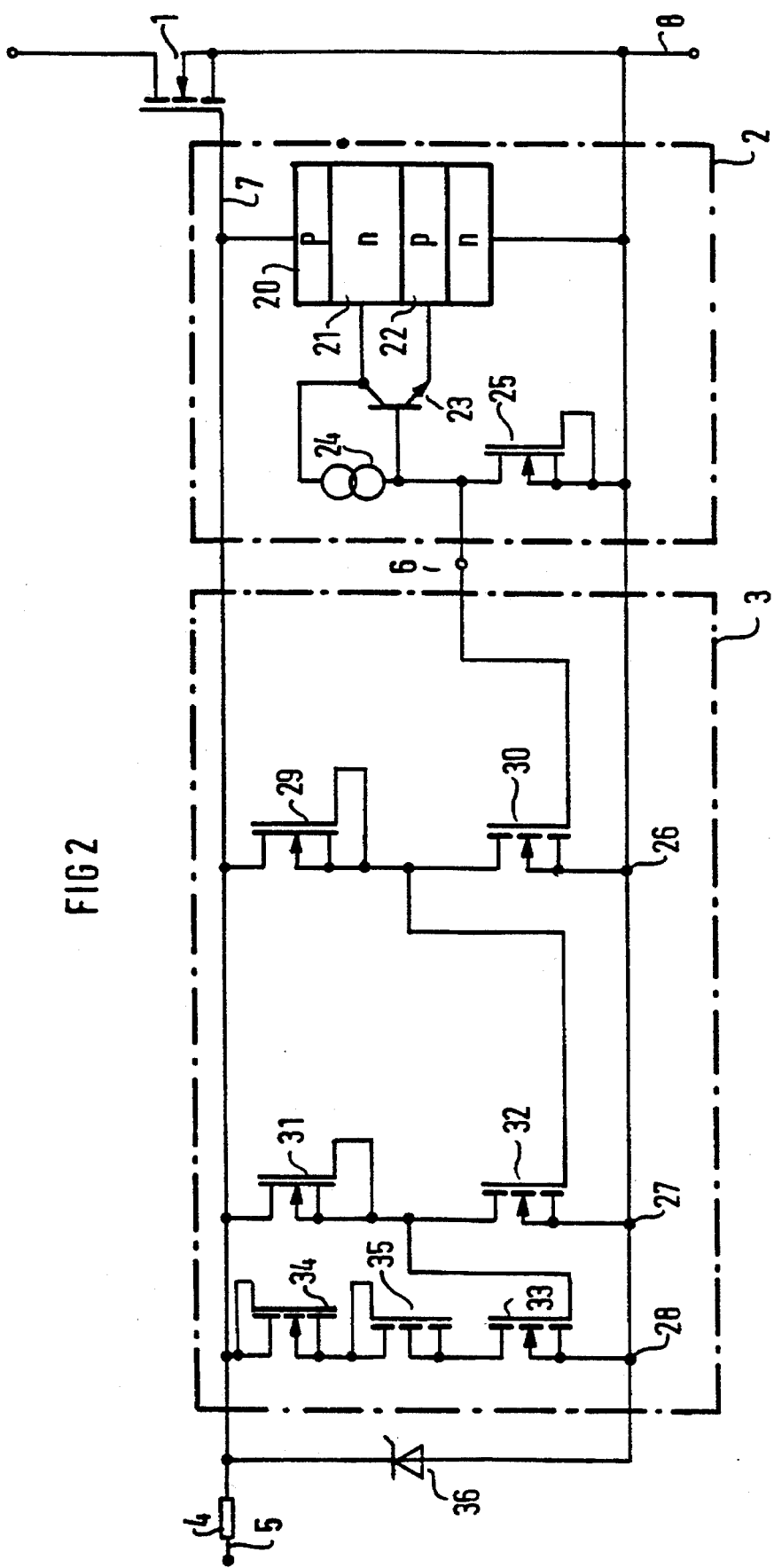
FIG. 2 is a circuit diagram of a first embodiment of the semiconductor component of the present invention.

In FIG. 2 is shown a circuit embodying the first and second means 2 and 3 of the invention. As a semiconductor switch, the first means 2 includes a thyristor 20 having an anode connected to the gate terminal 7 of the MOSFET 1 and having a cathode which is connected to the source terminal 8 of the MOSFET 1. When the first temperature T1 is reached, the thyristor 20 is triggered essentially as the result of increasing leakage currents. The collector-emitter path of a bipolar transistor 23 is connected in parallel to the two middle zones 21 and 22 of the thyristor 20. A current source 24 which supplies a highly temperature-dependent current is connected between the collector and the base of the bipolar transistor 23. The current source 24 may be a photodiode whose cathode is connected to the collector and whose anode is connected to the base of the transistor 23, for example. A photodiode whose inhibit current is temperature-dependent may be employed in this circuit.

The base of the transistor 23 is connected via a current source to the source terminal 8 of the MOSFET 1. An n-channel MOSFET 25 of the depletion type whose gate and source electrodes are connected to one another is provided as the current source. The base of the transistor 23 is also connected to the output 6 of the first means 2. Due to the rising current of the current source 24 resulting from increases in temperature of the MOSFET 1, the voltage difference at the MOSFET 25 connected as a current source rises. The signal level of the terminal 6, consequently, is temperature-dependent and increases with increasing temperature.

Expediently, the first means 2 and the second means 3 are each monolithically integrated circuits, either separately or in common with one another. The second means 3 includes an invertor 26 at its input side which is followed by a further invertor 27 with which a switch element 28 is controlled. A current path between the gate and the source terminals of the MOSFET 1 is switched by the switch element 28, so that the gate-source voltage will be reduced as a result.

The invertor 26 is composed of a series circuit of the drain-source paths of two small n-channel MOSFETs 29 and 30 of the depletion type. The MOSFET 30 is controlled by the output 6 of the first means 2 and the MOSFET 29 is connected as a current source in that its gate and source electrodes are connected to one another. The resistance values of the drain-source paths of the MOSFETs 29 and 30 are matched to one another such that the invertor has its switching point when the temperature-dependent signal corresponds to the second temperature at which the second means 3 is to be activated. Of course, this switch level of the inventor must be set in conjunction with the level of the temperature-dependent signal at the output of the first means 2. Experience has shown that a switching point at a voltage level of 0.4 volts is desirable.

As a switching transistor, the invertor 27 contains an n-channel MOSFET 32 of the depletion type whose gate electrode is connected to the drain terminal of the MOSFET 30. The drain electrode of the MOSFET 32 is connected through a current source to the gate electrode terminal 7 of the MOSFET 1. The current source is preferably executed as an n-channel MOSFET 31 of the depletion type with connected gate and source electrodes.

As a switching transistor, the switch element 28 contains an n-channel MOSFET 33 of the enhancement type whose gate terminal is connected to the output of the invertor 27. The drain terminal of the MOSFET 33 is connected to the gate electrode 7 of the MOSFET 1 through two MOSFETs 34 and 35. The gate and drain electrodes of the MOSFETs 34 and 35 are each respectfully connected to one another so that they act as MOS diodes.

When the temperature-dependent signal at the output 6 of the first means 2 reaches the signal level corresponding to the switching temperature T2 of the second means 3, the signal is amplified through the two invertors 26 and 27. As a result, the MOSFET 33 is switched on so that a current flows from the terminal 5 through the resistor 4 to the source terminal 8 of the MOSFET 1. The current is limited by the MOSFETs 34 and 35. The voltage drop at the drop resistor 4 reduces the gate-source voltage of the MOSFET 1 so that the operating temperature also drops. The invertors 26 and 27 are to be so dimensioned that they use little current in comparison to the activated state of the switch element 28.

The gate-source path of the MOSFET 1 can may be preferably protected against excessively high input voltages at its terminal 5 of the semiconductor component by the use of a Zener diode 36.

Figure 3:
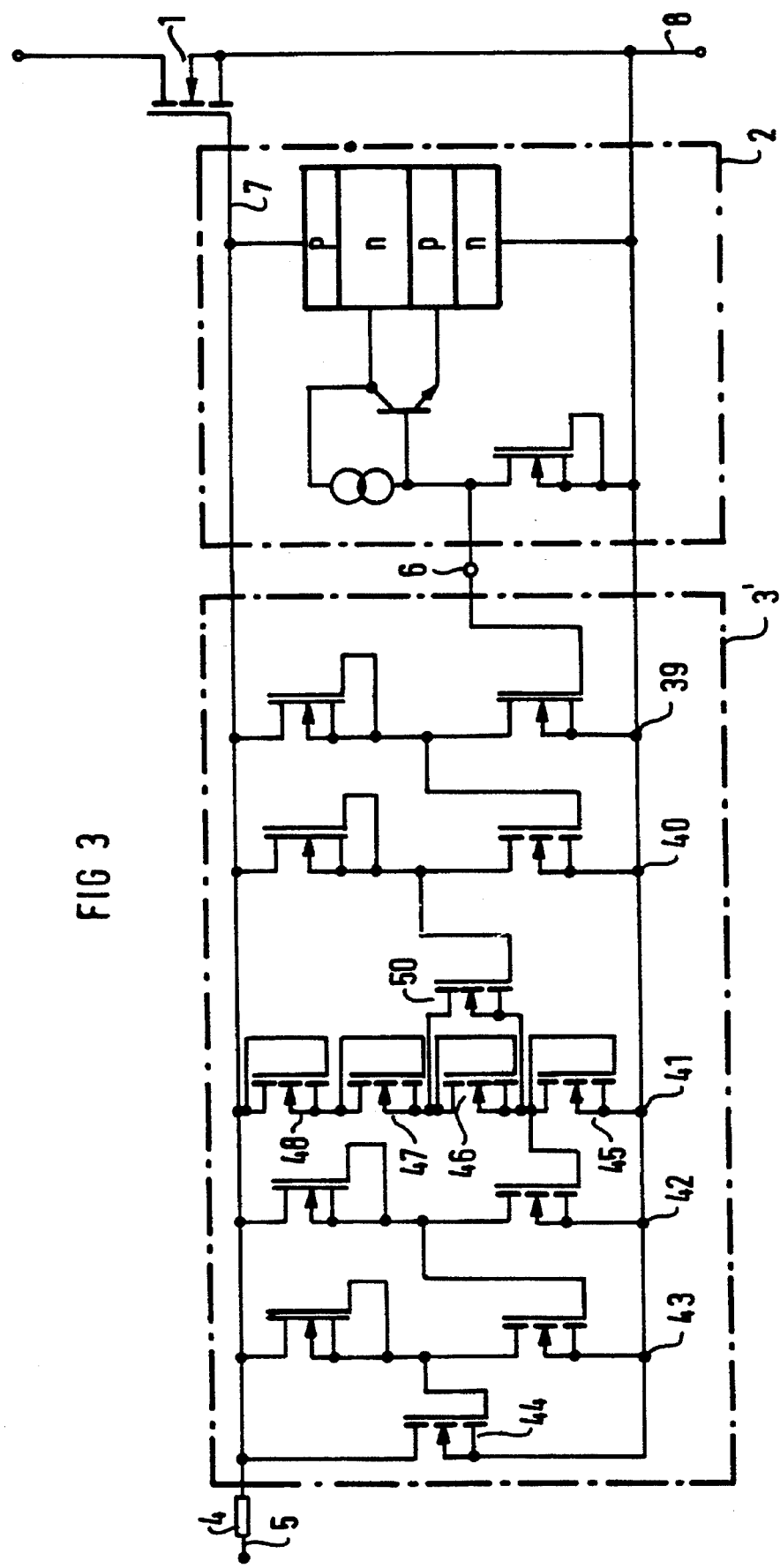
FIG. 3 is a circuit diagram of a second embodiment of the semiconductor component of the invention.

As shown in FIG. 3, a second embodiment of the semiconductor component contains the means 2 which is already disclosed FIG. 2 for generating temperature-dependent voltage signal at the output 6. A second embodiment of the second means 3', however is shown in FIG. 3. At its input side, the second means 3' includes two invertors 39 and 40 which correspond to the invertors 26 and 27 of FIG. 2. Also included are four n-channel MOSFETs 45, 46, 47 and 48 of the enhancement type which have their drain-source paths connected in series. The MOSFETs 45, 46, 47 and 48 are connected as MOS diodes in that their gate and drain electrodes are respectfully connected to one another. The drain terminal of the transistor connected to the source terminal 8 of the MOSFET 1 is connected to an invertor 42. The output of the invertor 42 drives a n-channel MOSFET 44 of the enhancement type through a further invertor 43. The drain-source path of this further n-channel MOSFET 44 of the enhancement type is connected between the gate and source electrodes 7 and 8 of the MOSFET 1. The gate-source voltage of the MOSFET 1 is limited by the cooperative operation of the elements 41, 42, 43 and 44. Assuming that the potential at the input terminal 5 rises, the current is increased by the arrangement of 41 which consists of four MOS diodes 45 through 48. As a result, the drain potential of the MOSFET 45 rises. The invertors 42 and 43 handle the amplification of the drain potential of the MOSFET 45. The MOSFET 44 is driven to a highly conductive state, which causes a voltage drop at the diode arrangement 41 to decrease to such an extent that the MOSFET 44 again switches to a high-impedance state. This regulation insures that the gate-source voltage of the MOSFET 1 is limited.

A further MOSFET 50 is connected parallel to the drain-source path of the MOSFET 46 of the arrangement 41. The gate electrode of the MOSFET 50 is controlled by the output of the invertor 40. When the level of the temperature-dependent signal has reached the value corresponding to the switching temperature T2 of the second means 3, the invertors 39 and 40 switch so that the MOSFET 50 is switched to a conductive state. As a result, the MOS diode formed by the MOSFET 46 becomes ineffective. Consequently, the gate-source voltage of the MOSFET 1 is limited to a lower voltage due to the above-described operation of the elements 41 through 44. This insures that the temperature of the MOSFET 1 decreases. The elements 39 through 43 thereby are to be dimensioned such that they carry a slight current in comparison to the active condition of the MOSFET 44.

While the embodiment of the second means 3 shown in FIG. 2 has a resistor-like characteristic for the gate-source voltage of the MOSFET 1 for rising control voltages at the terminal 5, a steeply rising characteristic similar to that of a Zener diode derives for the rising input voltages at the terminal 5 in the second embodiment as shown in FIG. 3.

Thus, there is shown and described a MOSFET temperature protection circuit, including a switch element which is thermally coupled to the MOSFET and which switches the MOSFET off when a critical temperature is reached by connecting the gate and source electrodes of the MOSFET. The switch element generates a temperature-dependent signal which controls a second means that is activated between the gate and source electrodes of the MOSFET to reduce the voltage therebetween when a second temperature which is lower than that of the critical temperature is reached. As a result, the gate-source voltage of the MOSFET and the current flowing therethrough is reduced, and the temperature increase is slowed.

Although other modifications and changes may be suggested by those skilled in the art, it is the intention of the inventors to embody within the patent warranted hereon all changes and modifications as reasonably and properly come within the scope of their contribution to the art.

I claim:

1. A semiconductor component, comprising:

a MOSFET having a gate terminal and a source terminal;

first means for generating a temperature-dependent signal connected to said gate terminal and said source terminal, said first means being thermally coupled to said MOSFET, said first means including a switch having a pn-junction which is connected to connect said gate terminal and said source terminal when first a predetermined temperature is reached;

second means connected between said gate terminal and said source terminal and receiving said temperature-dependent signal for reducing a voltage at said gate terminal and said source terminal when a second predetermined temperature is reached, said second predetermined temperature being lower than said first predetermined temperature.

2. A semiconductor component as claimed in claim 1, wherein said second means comprises:

an first invertor having a switching point at a signal level of said temperature-dependent signal corresponding to said second temperature;

a second invertor having an in-put connected to an output of the first invertor;

a controllable voltage reducing element connected to receive an output signal of said second invertor so as to be driven to a condition of lower resistance by said output signal.

3. A semiconductor component as claimed in claim 2, wherein said MOSFET comprises a first MOSFET, said invertor comprises a second and third MOSFETs of a depletion type, said second and third MOSFETs being connected with drain-source paths thereof in series between said gate and source terminals of said first MOSFET, a drain terminal of second MOSFET being connected to a gate terminal of said first MOSFET, a gate terminal and a source terminal of said second MOSFET being connected to a drain terminal of said third MOSFET and to an output of said invertor, a gate terminal of said third MOSFET being controlled by said temperature-dependent signal.

4. A semiconductor component as claimed in claim 2, wherein said controllable voltage reducing element includes a fourth MOSFET and a fifth MOSFET each respectively having connected drain and source terminals, drain-source paths of said fourth and fifth MOSFETs of said controllable voltage reducing element being connected in series between the gate and source terminals of said first MOSFET, and wherein said invertor is a first invertor, and further comprising a second invertor connecting a gate terminal of said fifth MOSFET of said controllable voltage reducing element to an output of said first invertor.

5. A semiconductor component as claimed in claim 1, further comprising:

a Zener diode connected in a non-conducting direction between the gate and source terminals of said first MOSFET.

6. A semiconductor component as claimed in claim 2, wherein said controllable voltage reducing element includes a fourth and a fifth MOSFET each having respectively connected drain and source terminals, drain-source paths of said fourth and fifth MOSFETs of said controllable voltage reducing element being connected in series between said gate and source terminals of said first MOSFET, said controllable voltage reducing element including a sixth MOSFET having a drain-source path connected between said gate and source terminals of said first MOSFET, a gate terminal of said sixth MOSFET being connected to a drain terminal and to a gate terminal of said fourth MOSFET of said controllable voltage reducing element, wherein said invertor is a first invertor, and further comprising:

a second invertor, a seventh MOSFET having a drain-source path connected parallel to a drain-source path of the fifth MOSFET and having a gate terminal connecting via said second invertor to an output of said first invertor.

7. A semiconductor component as claimed in claim 6, wherein said controllable voltage reducing element includes third and fourth invertors having signal paths connected in series and connected between the gate terminal of the sixth MOSFET of the voltage-reducing element and the gate and drain terminals of the fourth MOSFET of the voltage-reducing element.

8. A semiconductor component as claimed in claim 7, wherein said third and fourth invertors each contain a MOSFET of an enhancement type; source terminals of said MOSFETs of said third and fourth invertors being connected to said source terminal of said first MOSFET; and current sources connecting drain terminals of each of said MOSFETs of said third and fourth invertors to the gate terminal of said first MOSFET.

9. A semiconductor component as claimed in claim 8, wherein said current source includes a MOSFET of a depletion type having gate and source terminals are connected to one another.

10. A semiconductor component as claimed in claim 1, wherein said first and the second means are monolithically integrated.

* * * * *